United States Patent [19]

Marinace

[11] Patent Number: 4,945,857
[45] Date of Patent: Aug. 7, 1990

[54] PLASMA FORMATION OF HYDRIDE COMPOUNDS

[75] Inventor: John C. Marinace, Yorktown Heights, N.Y.

[73] Assignee: International Business Machines Corporation, Armonk, N.Y.

[21] Appl. No.: 323,714

[22] Filed: Mar. 15, 1989

Related U.S. Application Data

[63] Continuation of Ser. No. 117,443, Nov. 3, 1987, abandoned, which is a continuation of Ser. No. 839,760, Mar. 14, 1986, abandoned.

[51] Int. Cl.$^5$ .................................................. C23C 16/50
[52] U.S. Cl. .................................... 118/719; 118/723; 427/39
[58] Field of Search ................... 118/723, 719; 427/39

[56] References Cited

U.S. PATENT DOCUMENTS 4,505,949  3/1985  Jelks .................................... 427/39

Primary Examiner—Richard Bueker
Attorney, Agent, or Firm—Blaney Harper; Maurice H. Klitzman; Jeffrey S. LaBaw

[57] ABSTRACT

The synthesis of hydride compounds by reacting both the ingredients of the compound and the hydrogen together in the presence of energy sufficient to ionize the hydrogen. An inert bombardment ingredient enhances efficiency. In situ generation of ingredients such as arsine is provided within the reactor adjacent the deposition site in chemical vapor deposition.

8 Claims, 3 Drawing Sheets

PLASMA FORMATION OF HYDRIDE COMPOUNDS

This is a continuation of application Ser. No. 117,443 filed Nov. 3, 1987 now abandoned, which is a continuation of application Ser. No. 839,760, filed Mar. 14, 1986, now abandoned.

DESCRIPTION

1. Technical Field

The invention involves the formation of hydride compounds. Such compounds have at least two ingredients, one of which is hydrogen, and have as principle properties; a gaseous form with a capability that permits removal of the hydrogen in a later, minimum energy involvement reaction thereby leaving the remaining portion of the hydride compound for use in a further reaction. Hydride compounds generally in the art are formed by the reactions of metals and acids. The compounds, however, are generally highly toxic, and often explosive.

Recently, the use of hydride compounds of the elements employed in semiconductor technology has been found to be advantageous in connection with the chemical vapor deposition technology. In this technology, gases containing the various ingredients used in the semiconductor structure are caused to undergo a transformation, usually by decomposing, freeing thereby an ingredient in the vicinity of a semiconductor crystal so that the ingredient becomes part of the crystal structure.

In such applications, there are considerations of purity of the ingredients and handling problems involved with the highly toxic hydride compounds.

2. Background Art

In the formation of Gallium Hydride ($Ga_2H_6$) in the "Chemistry of the Hydrides" text by Hurd, published by Wiley 1952, page 99, the use of a glow discharge is described to prepare the hydrogen for reaction.

In the formation of Arsenic Hydride (Arsine $AsH_3$) in the Mellor Inorganic Chemistry text, published by Wiley, page 837, nascent hydrogen $H^+$ is described as the hydrogen reactant.

In U.S. Pat. No. 4,151,058, in the hydrogenation of unsatisfied bonds in amorphous silicon semiconductor devices, the hydrogen ($H_2$) is converted to H.

In U.S. Pat. No. 4,514,437, the use of an electromagnetic energy plasma is employed to vaporize ingredients to be deposited at a deposition site.

DISCLOSURE OF THE INVENTION

The invention is the formation of hydride compounds by reaction of gaseous hydrogen with the other hydride compound ingredients in either gaseous, solid or liquid form in a location having an externally impressed source of ionizing energy, the location being upstream of a vapor deposition site in a controlled environment deposition apparatus.

Figure 1:
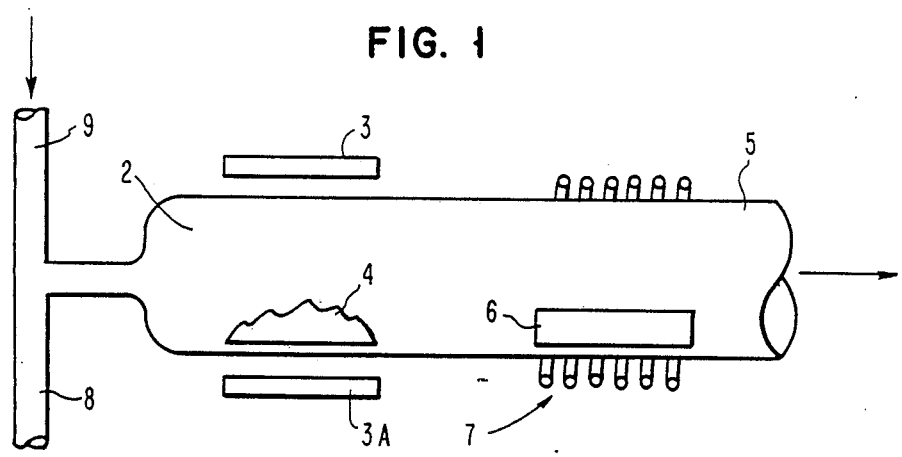
FIG. 1 is a schematic illustration of an apparatus providing the parameters employed in the invention.

Referring to FIG. 1, a schematic apparatus is shown illustrating the parameters to be provided and controlled in accordance with the invention. In FIG. 1, a controlled environment container 1 is provided having a reaction site 2 in which is provided an ionizing energy, shown schematically as plates 3 and 3A. The energy preferably is impressed by an electromagnetic source, such as a Tesla type coil, not shown, connected appropriately between plates 3 and 3A.

Positioned at the site 2, within the ionizing energy is a quantity 4 of the ingredient other than hydrogen to be formed in the hydride compound. The site 2 is adjacent and upstream of a deposition site 5 at which the hydride compound is caused to decompose in the presence of a deposition substrate 6 such as a semiconductor crystal. In typical deposition apparatus, substrate temperature control means, such as a heater 7, is provided in the deposition site, the hydrogen ingredient is introduced through a separate port 8.

In accordance with the invention, the reaction of the hydride ingredients, in the presence of the ionizing energy not only converts the hydrogen $H_2$ into $H^+$ but also provides a bombardment or sputtering effect both to the hydrogen and the other hydride ingredient or raw material 4 that operates to promote the reaction.

Further, in accordance with the invention, the reaction is found to be further enhanced through the introduction of an inert gas, such as argon, selected for atom or molecule size in bombardment, at another port in the system illustrated as 9. The presence of the inert gas provides more efficient hydride compound formation. The inert gas in one of the noble gases: helium, neon, argon, krypton, or xenon. The ingredient or raw material 4 may be provided in solid form, in liquid form or by local introduction through another port, not shown, in gaseous form.

The energy applied at the reaction site under the schematically illustrated elements 3 and 3A, should, at a minimum, be sufficient to ionize $H_2$ into H or nascent hydrogen. Higher levels of energy, however, will enhance the bombardment or sputtering aspect of the invention. In the presence of the energy, the hydrogen, an inert gas or the other ingredient itself is caused to engage in localized motion and collision which operates to remove oxides, exclude impurities, and promote reaction. This results in more efficient and purer hydride compound formation.

There are no stringent temperature requirements at the energy region 2 and room temperature is preferred.

While in the light of the description set forth, one skilled in the art will be able to apply the principles of the invention to many ingredients, for clarity, the following description will focus on the formation of the hydrides of the ingredients used with the semiconductor material GaAs including hydrides of As, P and Ga.

Figure 2:
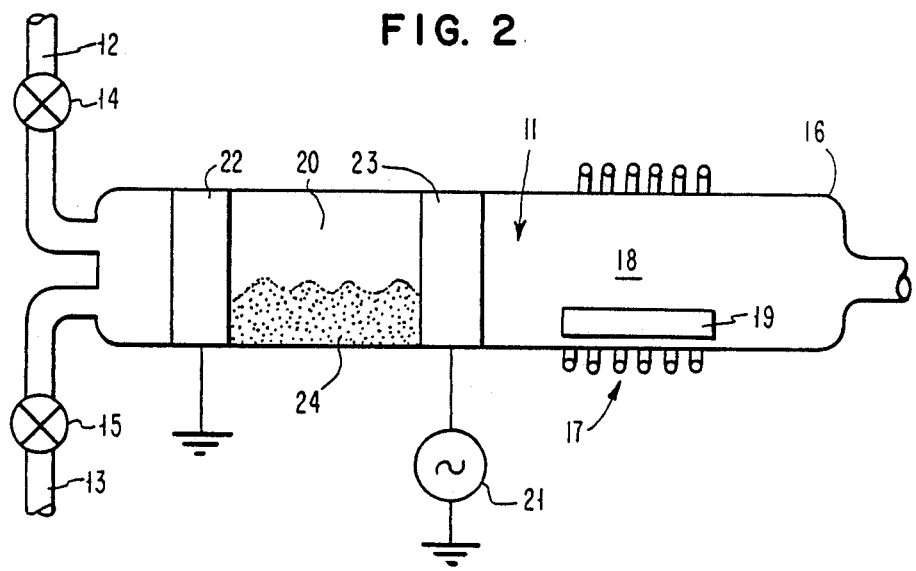
FIG. 2 is an illustration of an apparatus for performing semiconductor chemical vapor deposition with "in situ" hydride formation.

Referring next to FIG. 2, an illustrative apparatus is provided for the "in situ" generation and use of hydrides in a semiconductor application. In FIG. 2, a chemical vapor deposition type apparatus as used in semiconductor technology is shown. A reaction tube 11, such as quartz, is provided with a plurality of input ports 12 and 13 each controlled by a valve 14 and 15 respectively and with a gas output port 16. A heater 17, such as an electrical resistance type, is provided to control temperature at a deposition zone 18 wherein a substrate such as a Gallium Arsenide semiconductor monocrystal 19 is positioned. The gaseous ingredients, hydrogen and an inert gas which acts as a bombardment enhancing element such as argon, are introduced respectively at ports 12 and 13 under control of valves 14 and 15. Positioned upstream of the deposition region 18, an energy region 20 is provided wherein ionizing energy is applied. The ionizing energy is provided through a Tesla type coil and power supply well known in the art, shown schematically as element 21, connected across ground and the region 20 with contacts 22 and 23. The energy region 20 is maintained at room temperature. A quantity 24 of an ingredient for the hydride to be formed, such as solid As, is provided in the energy region 20.

In accordance with a further advantage of the invention, many impurities present in the ingredient positioned in the energy region do not form stable hydrides and thus when the hydride is formed, such impurities are eliminated resulting in a hydride gas product with greater purity than the ingredient sources. As an illustration, arsine formed in a plasma in accordance with the invention when decomposed, freeing the hydrogen, will be free of $GeH_4$ (Germane), a known impurity in commercially available Arsine.

In accordance with the invention, the principles of forming a hydride by the reaction of hydrogen with the other ingredients of the hydride in the presence of an ionizing energy may be extended through the provision of a separate branch to the formation of intermetallic semiconductor compounds by the formation of hydrides of each of the ingredients in a branch of the apparatus adjacent to the location where the deposition is to take place. The arrangement is illustrated in connection with FIG. 3 wherein in a deposition section of the controlled environment container 31 substrates 32 are positioned in a deposition region 33, the temperature of which is controlled by heater 34.

Upstream of the deposition region 33, two branches 35 and 35A are shown, each for a separate ingredient of the intermetallic crystal to be grown in the deposition zone 33. In branch 35, there will be an ingredient region 36 with the quantity of ingredient 37 therein. For this illustration, assume it to be arsenic, and a source of external energy supplied for illustration purposes is a Tesla type coil and power supply, well known in the art, shown schematically as element 38 connected across ground and region 36 with contacts 39 and 40. Hydrogen is supplied to branch 35 through port 41 under control of valve 42 and similarly, argon is supplied through port 43 under control of valve 44.

A similar construction is employed in branch 35A wherein in an energy region 45, a quantity of the ingredient, for this illustration Gallium, 46 is provided. The source of energy is again provided through a Tesla type coil 47 connected to ground through contacts 48 and 49, and hydrogen is supplied thrugh a port 50 under control of valve 51 and argon is supplied through a port 52 under control of a valve 53.

Figure 3:
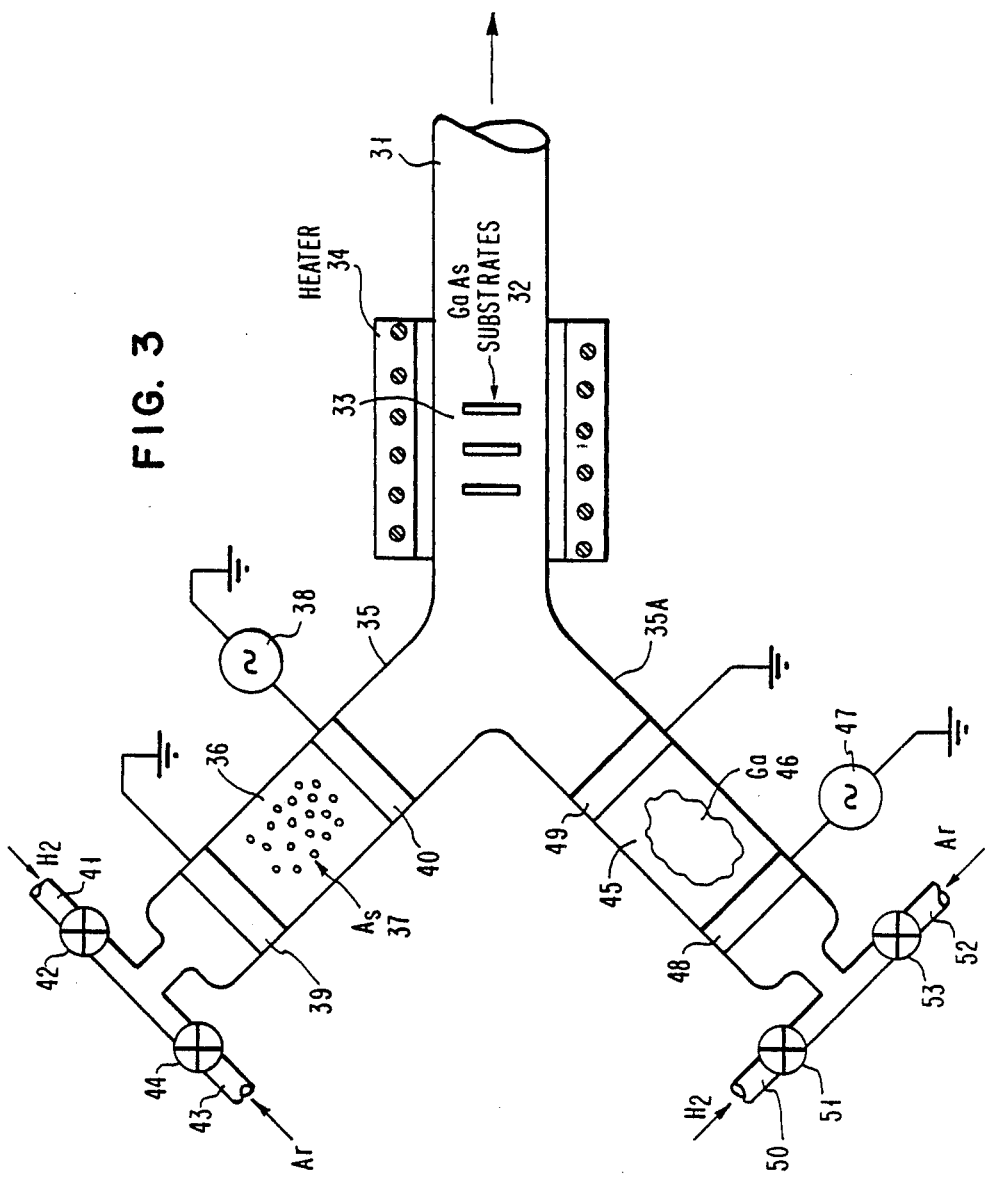
FIG. 3 is an illustration of an apparatus for forming a group III-group V intermetallic compound such as GaAs chemical vapor deposition with in situ hydride formation of the ingredients.
Figure 4:
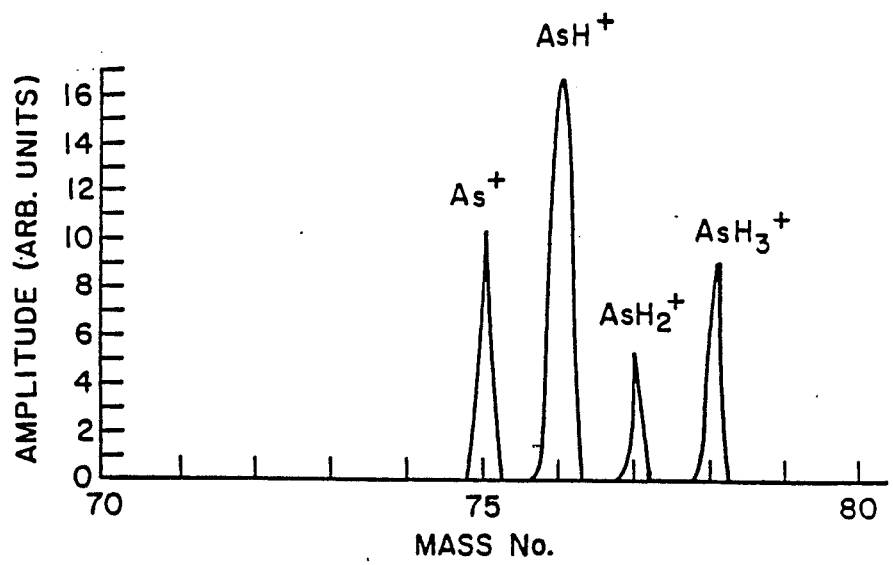
FIG. 4 is a gas analysis spectrum graph of arsenic hydride gases formed in accordance with the invention.

In the apparatus of FIG. 3, hydrides are formed in regions 36 and 45 of the respective ingredients in those regions and the hydrides are caused to decompose in the vicinity of the substrates, growing epitaxially a layer of a crystal made up of the two ingredients where, for purposes of illustration, the substrate is monocrystalline of gallium arsenide and as recited the ingredients are gallium and arsenic. Epitaxial layers of gallium arsenide will be formed.

BEST MODE FOR CARRYING OUT THE INVENTION

The preferred mode of carrying out the invention involves the apparatus of FIG. 2.

In operation, the energy in region 20 converts $H_2$ into nascent hydrogen H and simultaneously imparts energy to the atoms and molecules of the gases and ingredients present in the energy region 20 thereby causing the efficient formation of a hydride of the ingredient 24 in high purity. The hydride is thus formed "in situ" in the container 11 where it moves downstream and is caused to decompose over the substrate 19 by the temperature at that point under control of the heater 17, resulting in crystal growth of, or impurity incorporation into, a layer on the substrate 19.

EXAMPLE 1

In FIG. 2, the electrode spacing is not critical; an eleven centimeter (cm) spacing is employed. The plasma is not completely confined to the region 20 between the electrodes 22 and 23. A Tesla coil 21, manufactured by Electrotechnic Products, models BD10AS or BD50, with a voltage applied at or near maximum, estimated at 50 kV provides an output covering a broad frequency range, peaking at ~400 kHz with the power density in the plasma estimated to be about $1.0 \text{ w cm}^{-3}$. The pressure, monitored by a bourdon gauge and a thermocouple gauge, not shown, is maintained over the range of 0.3 to 30 Torr by means of a manual throttle valve, also not shown. The ingredient 24 is of gray As of stated 99.9999% purity and in lump form with dimensions ranging from ~0.5 to 1.5 cm. Any surface oxide is removed, at least partially, by heating to ~200° C. in a $H_2$ stream. The $H_2$ is maintained with a rated dewpoint of −70° C. (~1.0 ppm). The Ar is provided 99.999% pure. $AsH_3$ is formed under the following noncritical conditions:

$H_2$ flow rate = 200 ml min$^{-1}$

Ar flow rate = 25 ml min$^{-1}$

10 > Pressure > 2 Torr

The gas sample that is produced under these conditions, when analyzed using a residual gas analyzer, provides the spectrum shown in the graph of FIG. 3. The four gas species $As^+$, $AsH^+$, $AsH_2^+$ and $AsH_3^+$ have peak heights in good agreement with the published values of the cracking pattern for $AsH_3$ as published in "A Users Guide to Vacuum Technology", John F. O'Hanlon, John Wiley & Sons, New York, 1980, p. 385.

EXAMPLE 2

Again employing the apparatus of FIG. 2, $PH_3$ is produced in a similar procedure to Example 1. An Ar flow rate of 50 ml min$^{-1}$ is employed. Therefore, the Ar fraction in the stream then varies from 12.5% to 25%. It is not critical in this range. At very hight or very low values of Ar fraction, however, the yield could be markedly affected. The gas velocity through the reactor is estimated to be ~58 cm sec$^{-1}$, based upon the tube cross-section, a 225 ml min$^{-1}$ input at a pressure of 10 Torr. This estimate neglects the volume of the P in the source 24. Such a high velocity minimizes the time that the reactive species can interact. The yield can be increased by increasing the residence time in the region of the solid source.

Figure 5:
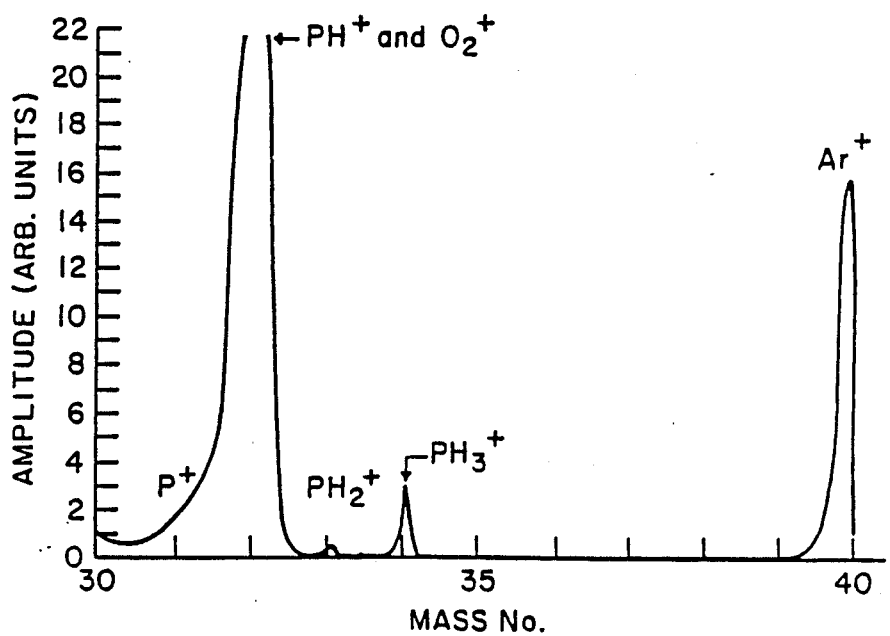
FIG. 5 is a truncated gas analysis spectrum graph of phosphorous hydride gases formed in accordance with the invention.

Referring to FIG. 5, gas samples produced under these conditions were analyzed using a residual-gas analyzer for the reaction products. FIG. 5 displays the mass-spectrometer spectrum of the $PH_3$, which also shows good agreement with published values of the cracking pattern for $PH_3$ as described in "A Users Guide to Vacuum Technology", John O'Hanlon, John Wiley & Sons, New York, 1980, p. 385. The peak at mass number 32 is partly due to $O_2^+$; other measurements show a peak at mass number 16, corresponding to $O^+$. The presence of the $O_2$ is considered to be due to a leak in the equipment or due to inadequate purging prior to the synthesis. The concentration of $PH_3$ in the $H_2$ and Ar is estimated to be 1.0 to 1.5%. It should be noted that the peak of the $PH_3$ trace in FIG. 5 has been truncated to the scale of FIG. 5 and in fact the peak is approximately double the scale.

What has been described is a technique and apparatus for the formation of hydride compounds wherein the compound ingredients and hydrogen are reacted together in the presence of energy at least sufficient to both ionize the hydrogen gas and simultaneously excite the compound ingredients.

I claim:

1. A semiconductor fabrication apparatus comprising:
   semiconductor formation site having means to decompose at least two gas products into a semiconductor at said semiconductor formation site,
   at least two reaction sites separate and upstream from said semiconductor formation site,
   means for providing a first phase of at least one raw material to a first reaction site,
   means for providing a second phase of at least one raw material to a second reaction site,
   means for providing hydrogen to at least two reaction sites,
   means for combining said raw material and said hydrogen at each of said reaction sites,
   means for subjecting said raw material and said hydrogen to plasma energy to induce said raw material and said hydrogen to form said gas product at said reaction site, and
   means for transporting each of said gas products to said semiconductor formation site.

2. The apparatus of claim 1 which further comprises:
   means for providing an inert gas to each reaction site provided with hydrogen.

3. The apparatus of claim 1 which further comprises:
   means to combine at least two of said gas products before the combination of gas products enters the semiconductor formation site.

4. the apparatus of claim 2 where said inert gas is Ar.

5. The apparatus of claim 4 where said raw material is As.

6. The apparatus of claim 4 where said raw material is P.

7. The apparatus of claim 4 where said raw material is Ga.

8. The apparatus of claim 4 wherein:
   said raw material for at least one of said gas products being chosen from the group of As and P and said raw material for at least one gas product being Ga.

* * * * *